United States Patent [19]

Yoshida et al.

[11] Patent Number: 5,575,887

[45] Date of Patent: Nov. 19, 1996

[54] PLASMA ETCHING METHOD AND DEVICE MANUFACTURING METHOD THEREBY

[75] Inventors: Takahiko Yoshida; Kazushi Asami, both of Okazaki; Muneo Yorinaga, Anjo; Tsuyoshi Fukada, Aichi-gun, all of Japan

[73] Assignees: Nippondenso Co., Ltd., Kariya; Nippon Soken, Inc., Nishio, both of Japan

[21] Appl. No.: 409,530

[22] Filed: Mar. 24, 1995

[30] Foreign Application Priority Data

Mar. 25, 1994 [JP] Japan .................................. 6-079384

[51] Int. Cl.$^6$ .................................................. H01L 21/00
[52] U.S. Cl. ...................... 156/643.1; 156/657.1; 156/345; 156/659.11; 216/41; 216/67; 216/79
[58] Field of Search ........................... 156/345 P, 643.1, 156/657.1, 659.11; 216/41, 67, 79

[56] References Cited

U.S. PATENT DOCUMENTS

| 4,209,357 | 6/1980 | Gorin et al. | 156/634.1 X |
| 4,859,277 | 8/1989 | Barna et al. | 156/643.1 X |

FOREIGN PATENT DOCUMENTS

| 57-32376 | 2/1982 | Japan . |
| 2275626 | 11/1990 | Japan . |
| 2268428 | 11/1990 | Japan . |
| 5275190 | 10/1993 | Japan . |

*Primary Examiner*—William Powell
*Attorney, Agent, or Firm*—Cushman Darby & Cushman

[57] ABSTRACT

A plasma etching method, which can form concave parts and/or opening parts on a substrate by performing etching at a high speed and does not damage an element part formed on the surface of the substrate, is disclosed. On a semiconductor substrate with one surface as an element part forming surface and the other surface having an insulating film thereon as an etching surface are formed concave parts and/or opening parts by means of etching by applying a high-frequency electric power to a reactive gas and generating plasma thereby. The substrate is disposed on an electrode having grounded electric potential with the insulating film positioned on the lower side and a conductive part material having grounded electric potential is disposed around the substrate. When one end of the conductive part material is contacted with the side of the etching surface of the substrate, electric charge generated on the surface of the substrate moves to the conductive part material, and the electric potential of the substrate is lowered.

13 Claims, 4 Drawing Sheets

5,575,887

PLASMA ETCHING METHOD AND DEVICE MANUFACTURING METHOD THEREBY

CROSS REFERENCE TO RELATED APPLICATION

This application is based upon and claims the benefit of priority of the prior Japanese Patent application No. 6-79384 filed on Mar. 25, 1994, the contents of which are incorporated herein by reference.

BACKGROUND OF THE INVENTION

1. Field of the Invention

The present invention generally relates to a plasma etching method. More particularly, the present invention relates to a plasma etching method for performing etching by means of plasma generated by high-frequency electric discharge to form concave parts and/or opening parts on a surface of a substrate in a manufacturing process for a silicon microprocessing type device.

2. Related Arts

In a manufacturing process for a silicon microprocessing type device such as a pressure sensor and an acceleration sensor, concave parts, which forms a thin part serving as pressure detecting parts, and/or opening parts are formed by means of etching method performed from the rear surface of a semiconductor substrate after the formation of an element part on the main surface of the semiconductor substrate. As a means for forming the concave parts and/or opening parts, a method of anode coupling type plasma etching by using a reactive gas plasma has drawn attention as disclosed in the Japanese Unexamined Patent Publication No. 2-275626, for example.

In the above processing technique, etching speed should be high, the side walls of the concave parts should be perpendicularly etched and the roughness of the etching surface should be small. Particularly, as the concave parts should be deeply formed to some degree, etching amount should be increased, and therefore it takes a longer time to complete etching and further increase in the etching speed has been desired.

As methods for increasing the etching speed, it is conceivable that the applying electric power should be increased, the reactive gas pressure or gas flow rate is increased or the substrate is heated. However, any of these methods directly or indirectly results in the increase in ion energy shot to the substrate, which increases the electric potential of the surface of the substrate.

When a semiconductor element part has been formed on a surface of the substrate (on the opposite side to the etching surface) beforehand, like a pressure sensor, generally an insulating film is formed on the surface of the element part, and furthermore, a resist material, etc, are coated thereto prior to the etching to protect the circuit formed thereon. If the substrate arranged as above is etched, the insulating film or the resist material comes to contact the grounding electrode, whereby the electric charge accumulated on the surface of the substrate can not move, and therefore the electric potential of the substrate turns to be in the floating state. As a result, damage may be caused such as partial breakdown to the insulating film, comparatively large leak current caused by the occurrence of fixed electric charge due to the fixation of excessive electric charge to lattice defect, and the lowering of the amplification factor of the transistor.

SUMMARY OF THE INVENTION

Therefore, it is a primary object of the present invention to provide a plasma etching method which can form the concave parts and/or the opening parts at a high speed and does not damage the element part formed on the surface of the substrate.

Now, the points of the present invention will be described. According to the present invention, when a plasma etching is performed on a semiconductor substrate having an element formation surface and an etching surface which opposes to the element formation surface, the element formation surface is covered with an insulating film, plasma is generated by applying high-frequency electric power to a reactive gas to thereby form concave parts and/or opening parts on the etching surface. In this arrangement, the substrate is disposed on a grounding electrode having grounded electric potential with both the insulating film and the element formation surface positioned on the lower side, a conductive member having the grounding electric potential is disposed around the substrate, and etching is performed with one end of the conductive member contacted with the side of the etching surface of the substrate to permit electric charges to move to the conductive member via the contacting portion.

The conductive member may be disposed to be in contact with the grounding electrode to have grounded eclectic potential. The substrate may include an etching mask made of a metal on the top surface of the etching surface, and the conductive member may be disposed to be in contact with the etching mask.

A protective member composed mainly of components identical to main components of the substrate may be disposed on the top surface of the conductive member. The conductive member may be annually formed with an inner diameter slightly larger than an outer diameter of the substrate and disposed to surround a circumference of the substrate, and the top end part of the inner peripheral wall of the conductive member may be inwardly protruded to contact the peripheral surface of the etching surface of the substrate.

The increase in the electric potential of the substrate caused by the generation of discharge plasma is considered to be attributed to the electric charge generated on the insulating film of the substrate. In order to prevent the degradation in the element characteristics due to this electric charge, the electric potential of the substrate must be lowered. However, as the surface of the substrate in contact with the grounding electrode is covered with a resist material for protecting the circuit formed thereon, the electric charge generated thereon can not be extracted to the grounding electrode 5.

According to the present invention, as the grounded conductive member is contacted with the surface on the side opposite to the grounding electrode of the substrate, excessive electric charge on the surface of the substrate can be released through this conductive member, whereby the occurrence of leak current due to the increase in electric potential and the lowering in the amplification factor of the transistor can be prevented. Furthermore, if the conductive member is contacted with the surface of the substrate by using the metal etching mask, electric charge can smoothly be moved.

If the conductive member is disposed in such a way that the other end thereof can contact with the grounding electrode, electric potential can easily be grounded. Specifically, by annually forming the conductive member and disposing the same around the substrate, the conductive member can easily be structured so as to contact both the peripheral surface of the substrate and the electrode.

Furthermore, if the conductive member is sputtered and therefore the top surface of the substrate is roughed, this sputter etching of the conductive member can be prevented by disposing a protective member on the top surface of the conductive member. Moreover, if the protective member is made of the material composition identical with the material composition of the substrate, even if sputter etching is caused to the conductive member, the influence of the sputter etching on the top surface of the substrate can be reduced.

BRIEF DESCRIPTION OF THE DRAWINGS

These and other objects, features and characteristics of the present invention will be appreciated from a study of the following detailed description, the appended claims, and drawings, all of which form a part of this application. In the drawings:

DETAILED DESCRIPTION OF THE PRESENTLY PREFERRED EXEMPLARY EMBODIMENTS

Figure 1:
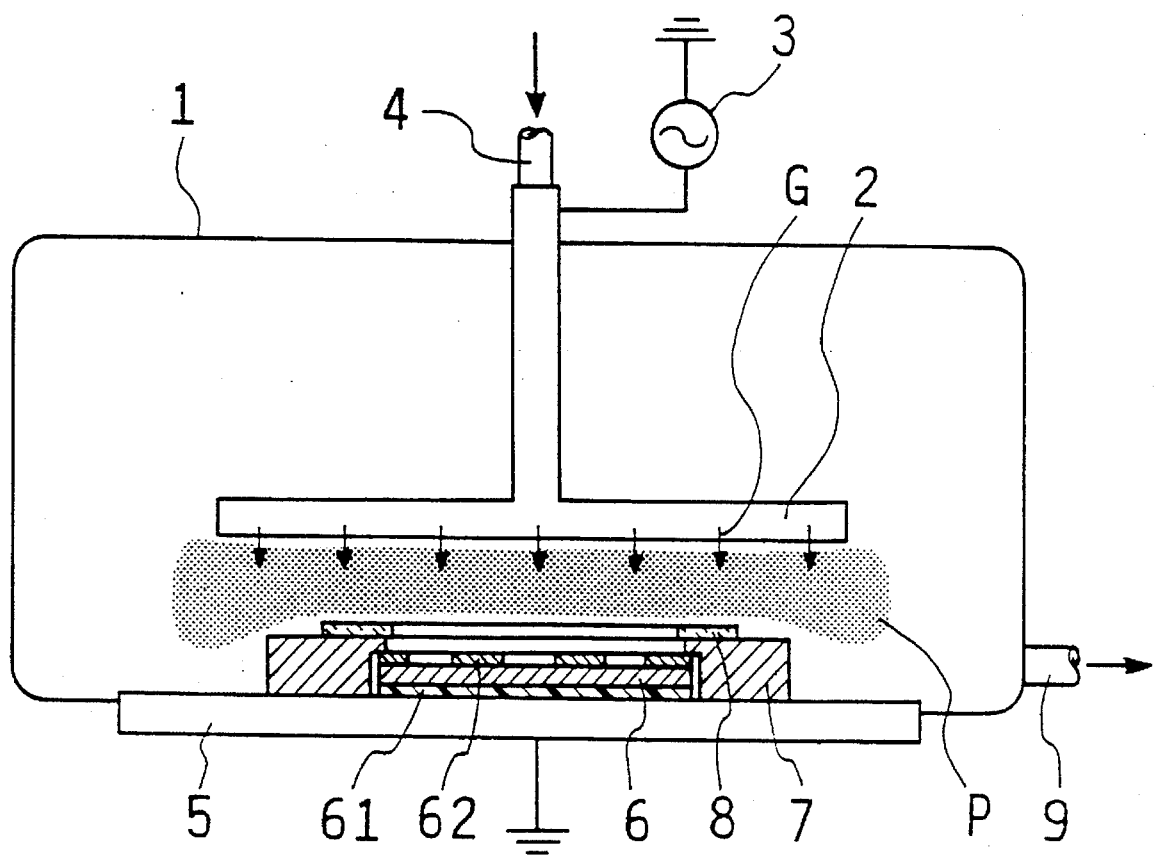
FIG. 1 is a schematic view showing an etching apparatus used for an embodiment according to the present invention.

FIG. 1 is a schematic view illustrating an anode coupling parallel flat plate type dry etching apparatus used for an embodiment according to the present invention. Within a reactive chamber 1 is disposed an electrode 2 to which a high-frequency electric power is applied roughly in the central part thereof, and the electrode 2 is disposed so as to be applied with a high-frequency electric power from a high-frequency electric power source 3. To the upper end part of the electrode 2 is connected a reactive gas introduction pipe 4. Reactive gas G introduced into the reactive chamber 1 through the introduction pipe 4 sprays from a gas diffuser provided in the bottom surface of the electrode 2.

On the bottom surface of the reactive chamber 1 is disposed a grounding electrode 5 facing the electrode 2. On the top surface of the grounding electrode 5 is disposed a substrate 6 to be etched, and an aluminum plate 7 which is a conductive member is disposed to surround the substrate 6. On the top surface of the aluminum plate 7 is disposed a quartz plate 8 which is a protective member.

The substrate 6 is made of monocrystalline silicon, for example. On the bottom surface of the substrate 6 is formed beforehand semiconductor element part including a transistor circuit, the surface of which is covered with an insulating film 61. Furthermore, an exposed circuit part is generally coated with a protective resist material. On the top surface of the substrate 6 is covered with an etching mask 62 excluding portions where concave parts and/or opening parts are to be formed. As a material of the etching mask 62, a metal like chrome and aluminum and an organic material can be used. Considering contact with the aluminum plate 7 (described herein later), however, it is preferable that the metal should be used. Particularly, the use of chrome or a chrome compound can control the surface roughness of the etching surface.

The aluminum plate 7 is annular whose inside diameter is slightly larger than the outside diameter of the substrate 6, surrounding the substrate 6 with a clearance formed between the aluminum plate 7 and the substrate 6. The upper end part of the aluminum plate 7 inwardly protruded to contact the top and peripheral surface of the etching mask 62, while the bottom of the aluminum plate 7 is supported on the electrode 5, having a grounded electric potential. In this arrangement, electric charge generated on the surface of the substrate 6 can move from the etching mask 62 through the aluminum plate 7 to the grounding electrode 5.

The quartz plate 8 is annular whose inside diameter is slightly smaller than that of the aluminum plate 7, covering the top surface of the aluminum plate 7 near the substrate 6 to protect the top surface of the aluminum plate 7 from being sputtered.

In performing plasma etching in the above arrangement, reactive gas is introduced by a flow rate controller (not illustrated) into the reactive chamber 1, high-frequency electric power is applied from the high-frequency electric power source 3, and thereby plasma P is generated. As a reactive gas, mixed gas of sulfur hexafluoride ($SF_6$) gas and oxygen ($O_2$) gas, for example, is used. It is preferable that the flow rate of the reactive gas should be 2 sccm or more per liter of the reactive chamber 1 and the electric power application should be 1 $W/cm^2$ per unit area of the electrode. On the other hand, the reactive chamber 1 is provided with a reactive gas exhaust pipe 9 on the bottom part side, and the inside of the reactive chamber 1 is maintained at a constant pressure by a vacuum exhaust system (not illustrated). Incidentally, the temperature of the electrode 5 can be controlled by a temperature controller (not illustrated) to maintain the temperature of the substrate 6 at a constant level.

As the plasma P has an extremely high reactivity, the silicon on the surface of the substrate 6 exposed without being covered with the etching mask 62 is etched and removed by physicochemical reaction, etc. thereof in associated with active species within the plasma P or reactive gas ions.

At this time, as the plasma P has a high electric potential, the surface electric potential of the substrate 6 increases, but the generated electric charge moves to the aluminum plate 7 through the etching mask 62 on the top surface of the substrate 6, and then to the grounding electrode 5. Accordingly, no electric charge accumulates on the surface of the substrate 6 and therefore adverse effect of electric charge on the element formation part can be prevented.

On the other hand, if the top surface of the aluminum plate 7 is sputtered and reacted on the reactive gas, it is possible that a reaction product adheres to the top surface of the substrate 6 and the top surface of the substrate 6 is roughed. In this embodiment, however, as the quartz plate 8 protects the aluminum plate 7, the top surface of the substrate 6 is not roughed. Incidentally, even if the top surface of the aluminum plate 7 apart from the substrate 6 is sputtered, the substrate 6 is influenced little, and therefore there is no need to cover the whole area of the aluminum plate 7 with the quartz plate 8. Furthermore, when a chloric gas is used as a reactive gas, as a reaction product resulted from reaction on the aluminum does not stay on the top surface of the substrate 6 but is apt to leave there, there is no need to provide the quartz plate 8.

In the above embodiment, the aluminum plate 7 is used as a conductive member. However, the conductive member should not be limited to the aluminum plate 7 but carbon, copper, chrome and other materials which have a sufficient conductivity are applicable and properly selected according to the material of the substrate 6 to be etched or the type of reactive gas. On the other hand, the protecting plate is not limited to the quartz plate 8 but any material which contains silicon (the material of the substrate 6) as the main material composition may be used with the same effect as the quartz plate 8. When the substrate 6 is not silicon, any material composition which has a similar material composition to the material of the substrate 6 may be used.

Figure 2:
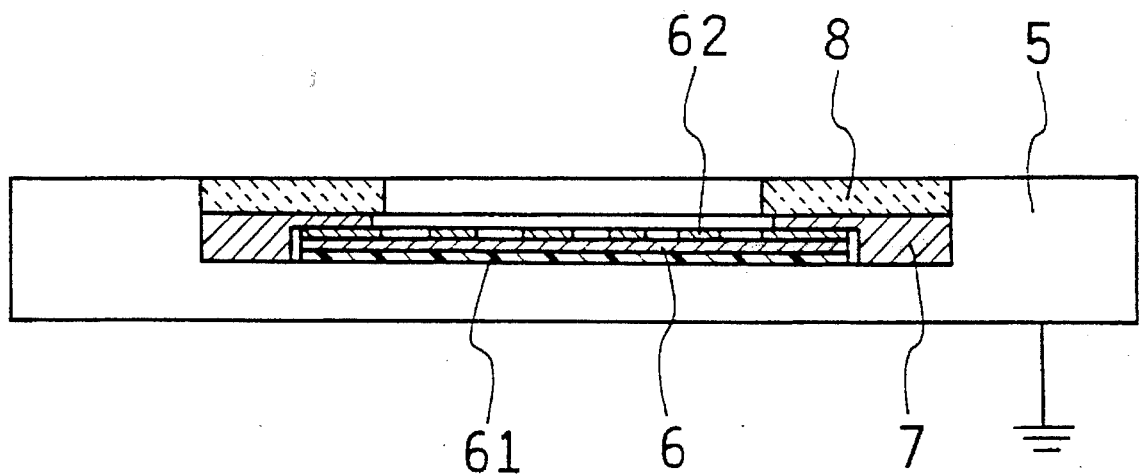
FIG. 2 is a cross-sectional view showing the contour of an electrode according to another embodiment of the present invention.

Incidentally, in the above embodiment, the substrate 6, the aluminum plate 7 and the quartz plate 8 are formed on the grounding electrode 5. It is also acceptable, however, that the substrate 6 is disposed within a recessed part formed in the electrode 5 for integral formation and the aluminum plate 7 and the quartz plate 8 are disposed thereon. In this arrangement, there is no need to protrudently form a contact part on the inner wall of the aluminum plate 7 to contact the substrate 6, and this simplifies the structure. Furthermore, as illustrated in FIG. 2, it is also acceptable that the substrate 6, the aluminum plate 7 and the quartz plate 8 are embedded within the electrode 5, which eliminates unevenness from the surface of the electrode 5, plasma can be uniformly generated, and etching is uniformly performed. Furthermore, it is also acceptable that a material other than metal is used as an etching mask. When an insulating mask is used, it is acceptable that a part of the mask is removed, the conductive member is directly contacted to the top surface of the substrate 6 through the removed part to ground the top surface of the substrate 6.

Figure 3:
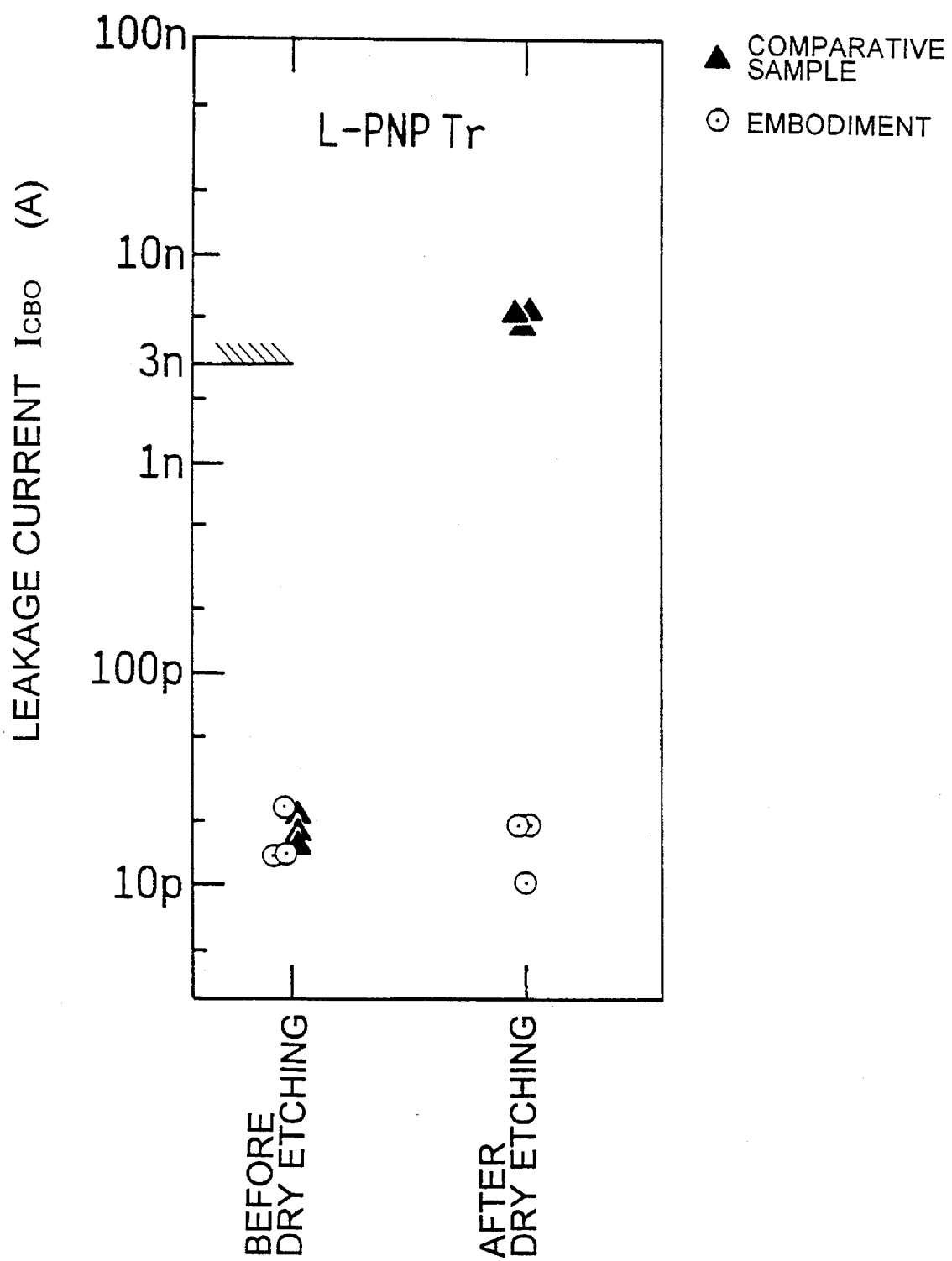
FIG. 3 is a graph showing the variation in the leak current of the transistor measured before and after etching.
Figure 4:
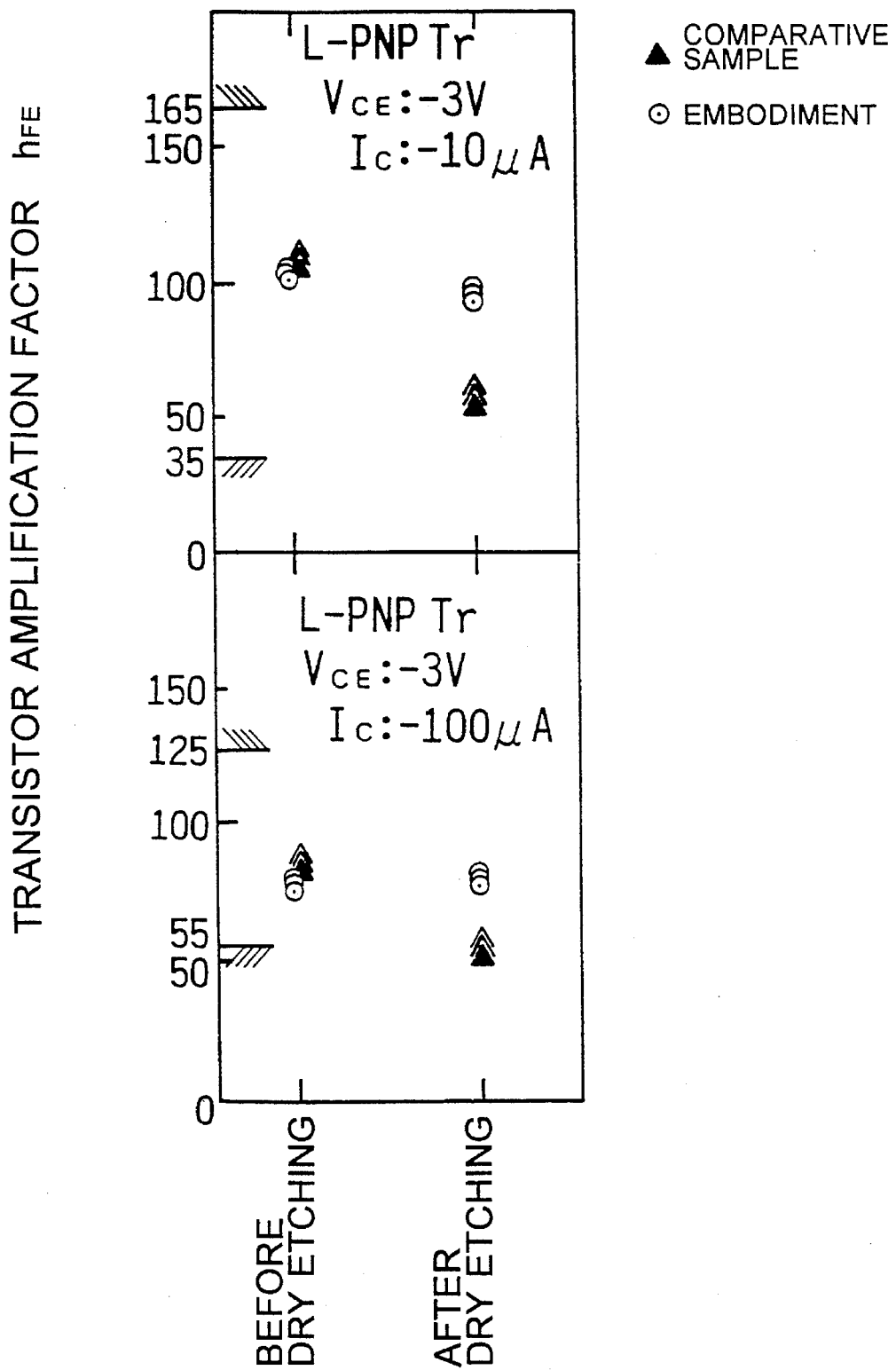
FIG. 4 is a graph showing the variation in the amplification factor of the transistor measured before and after etching.

The effect of the present invention was confirmed by performing plasma etching using the above apparatus. A lateral PNP transistor circuit was formed on the silicon substrate 6. As a reactive gas, mixed gas of sulfur hexafluoride ($SF_6$) gas and oxygen ($O_2$) gas (mixing ratio=70:30) was used. Etching was performed with a gas flow rate of 10 sccm per liter of the reactive chamber 1, a gas pressure of 0.3 Torr and an applying voltage of 1.3 W/cm$^2$ per unit area of the electrode, and the characteristics of the transistor were measured before and after the etching to examine the variation. FIG. 3 illustrates the variation in the leak current value, and FIG. 4 illustrates the measurement results as to the variation in the amplification factor of the transistor. Furthermore, for the purpose of comparison, the same experiment was tried to a case where the aluminum plate 7 and the quartz plate 8 were not provided, and the results of this experiment were plotted as to both cases in FIGS. 3 and 4. As evident from these figures, when the aluminum plate 7 and the quartz plate 8 were not provided, the leak current of the transistor increased and the amplification factor of the transistor lowered after the etching, while in this embodiment, both the leak current and amplification factor of the transistor varied little.

As described above, when the present invention is used, as the conductive member releases the electric charge from the surface of the substrate, the electric potential of the substrate does not increase. Accordingly, by increasing the applying electric power, the reactive gas pressure or the gas flow rate or by heating the substrate, the speed of the etching can be increased. Furthermore, as another excellent effect, there is no possibility of damaging the element part formed on the surface of the substrate due to the increase in the leak current.

While the present invention has been shown and described with reference to the foregoing preferred embodiments, it will be apparent to those skilled in the art that changes in form and detail may be made therein without departing from the scope of the invention as defined in the appended claims.

What is claimed is:

1. A plasma etching method for a semiconductor substrate having an element part forming surface on one surface and an etching surface on a surface opposing the element part forming surface, the method comprising the steps of:

disposing the semiconductor substrate on a grounding electrode having grounded electric potential at the element part forming surface side, wherein the element part forming surface of the semiconductor substrate is covered with an insulating film and the semiconductor substrate contacts the grounding electrode via the insulating film;

disposing a conductive member having a grounding electric potential around the substrate so as to be electrically connected to a side of the etching surface of the substrate; and performing an etching by providing an opposite electrode to which a high-frequency electric power is applied so as to face the grounding electrode with a reactive gas interposed therebetween, to form at least one of a concave part and an opening part on the etching surface while the conductive member contacts the etching surface of the substrate to allow electric charge to move to the conductive member.

2. The plasma etching method according to claim 1, wherein:

the element part forming surface includes a transistor; and the conductive member is in contact with the grounding electrode.

3. The plasma etching method according to claim 1, wherein the substrate includes an etching mask made of a metal on a top surface of the etching surface and the conductive member contacts the etching surface of the substrate via the etching mask.

4. The plasma etching method according to claim 1, wherein the conductive member is made of a metal and a protective member composed mainly of components identical to main components of the substrate to protect a surface of the metal conductive member from being sputtered.

5. The plasma etching method according to claim 1, wherein the conductive member is annually formed with an inner diameter slightly larger than an outer diameter of the substrate and disposed to surround a circumference of the substrate and a top end part of an inner peripheral wall of the conductive part material is inwardly protruded to contact a periphery of the etching surface of the substrate.

6. A manufacturing method for a silicon microprocessing type device in which a semiconductor element part is provided on a side of a surface of a substrate, an insulating film is formed on a surface of the semiconductor element part and wall parts are formed by plasma etching on a side of a back surface of the substrate, the manufacturing method comprising:

a step for fixing a surface of the substrate on which the semiconductor element part and the insulating film are formed to a grounding electrode of a dry etching apparatus;

a step for disposing an anode of the dry etching apparatus on a back surface of the substrate;

a step for adhering a conductive etching mask on the back surface of the substrate;

a step for electrically contacting a conductive metal plate around an etching mask and electrically connecting the etching mask and the back surface of the substrate with the grounding electrode through the conductive metal plate; and a step for applying high-frequency voltage to between the grounding electrode and the anode in order to generate a reactive gas plasma within the dry etching apparatus.

7. The manufacturing method for a silicon microprocessing type device according to claim 6, wherein a protective plate is provided on the side of the anode of the conductive metal plate to cover a part in proximity to the back surface of the substrate.

8. The manufacturing method for a silicon microprocessing type device according to claim 6, wherein a recessed part is formed on the grounding electrode, the recessed part houses the substrate, the etching mask, the conductive metal plate and the protective plate and a plane of the protective plate and a-plane of the grounding electrode both facing the anode are arranged to be on a substantially same plane.

9. A plasma etching method for a semiconductor substrate having a main surface and an etching surface opposing to the main surface, comprising the steps of:

disposing the semiconductor substrate on a grounding electrode to which is applied a grounded electric potential in such a state that the main surface of the semiconductor substrate is isolated from the grounding electrode by an insulating substance which covers the main surface of the semiconductor substrate;

disposing a conductive member having a grounded electric potential so that the conductive member is electrically connected to the etching surface of the semiconductor substrate; and performing an etching by providing an opposite electrode to which an electric power is applied so as to face the grounding electrode with a reactive gas interposed therebetween, to etch the etching surface while allowing electric charge generated in the semiconductor substrate to move to the conductive member.

10. A plasma etching method according to claim 9, wherein:

on a side of the main surface of the semiconductor substrate is formed a transistor structure; and the conductive member is in contact with the grounding electrode.

11. A plasma etching method according to claim 9, wherein an etching mask made of a metal is disposed on the etching surface of the semiconductor substrate and the conductive member contacts the etching surface of the semiconductor substrate via the etching mask.

12. A plasma etching method according to claim 9, wherein the conductive member is made of a metal and a protective member composed mainly of components identical to main components to the substrate to protect a surface of the metal conductive member from being sputtered.

13. A plasma etching method according to claim 9, wherein the conductive member is annularly formed with an inner diameter slightly larger than an outer diameter of the substrate and disposed to surround a circumference of the substrate and a top end part of an inner peripheral wall of the conductive part material is inwardly protruded to contact a periphery of the etching surface of the substrate.

* * * * *